(12) United States Patent
Melik-Martirosian

(10) Patent No.: US 7,443,746 B1
(45) Date of Patent: Oct. 28, 2008

(54) MEMORY ARRAY TESTER INFORMATION PROCESSING SYSTEM

(75) Inventor: Ashot Melik-Martirosian, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 612 days.

(21) Appl. No.: 11/253,521

(22) Filed: Oct. 18, 2005

(51) Int. Cl.
*G11C 7/00* (2006.01)

(52) U.S. Cl. .................. 365/201; 365/218; 365/189.011

(58) Field of Classification Search .................. 365/201, 365/218, 189.011
See application file for complete search history.

(56) References Cited

U.S. PATENT DOCUMENTS

| | | | |
|---|---|---|---|
| 6,560,568 B1 | 5/2003 | Singhal et al. | |
| 6,815,231 B2 | 11/2004 | Miura et al. | |
| 6,819,596 B2 | 11/2004 | Ikehashi et al. | |
| 6,914,817 B2 | 7/2005 | Harari | |
| 6,917,542 B2 | 7/2005 | Chen et al. | |
| 7,184,336 B2 * | 2/2007 | Chiang et al. | ............... 365/201 |

* cited by examiner

*Primary Examiner*—Anh Phung
*Assistant Examiner*—Nam Nguyen
(74) *Attorney, Agent, or Firm*—Mikio Ishimaru

(57) ABSTRACT

A memory array tester information processing system includes executing a generation block to gather drain currents and gate voltages information for a memory array, utilizing an extraction block to obtain the drain currents and the gate voltages a portion of the memory array and an entire memory array from the generation block or stored information, and executing an analysis block to operate on the drain currents and the gate voltages from the extraction block to correlate operations on the portion of the memory array and the entire memory array. The system includes utilizing a presentation block to format the information used in the analysis block and the results of the analysis block to compute a peak threshold voltage for the memory array.

20 Claims, 2 Drawing Sheets

MEMORY ARRAY TESTER INFORMATION PROCESSING SYSTEM

TECHNICAL FIELD

The present invention relates generally to semiconductor technology and more specifically to semiconductor research and development.

BACKGROUND ART

Modern consumer electronics, such as cellular phones, digital cameras, and music players, are packing more integrated circuits into an ever-shrinking physical space with the expectations of decreasing cost. Numerous technologies have been developed to meet these requirements. One cornerstone for consumer electronics to continue proliferation into everyday life is the non-volatile storage of information such as cellular phone numbers, and digital pictures, music files.

Moreover, in the coming years, portable systems will demand even more nonvolatile memories, either with high density and very high writing throughput for data storage application or with fast random access for code execution in place. The flexibility and cost make the Flash memory a largely utilized and mature technology for most of the non-volatile memory applications. Today, Flash sales represent a considerable amount of the overall semiconductor market.

Integrated circuits including non-volatile memories are made in and on wafers by extremely complex systems that require the coordination of hundreds or even thousands of precisely controlled processes to produce a finished semiconductor wafer. Each finished semiconductor wafer has hundreds to tens of thousands of integrated circuits, each worth hundreds or thousands of dollars.

The ideal would be to have every one of the integrated circuits on a wafer functional and within specifications, but because of the sheer numbers of processes and minute variations in the processes, this rarely occurs. "Yield" is the measure of how many "good" integrated circuits there are on a wafer divided by the total number of integrated circuits formed on the wafer divided by the maximum number of possible good integrated circuits on the wafer. A 100% yield is extremely difficult to obtain because minor variations, due to such factors as timing, temperature, and materials, substantially affect a process. Further, one process often affects a number of other processes, often in unpredictable ways.

In a manufacturing environment, the primary purpose of experimentation is to increase the yield. Experiments are performed in-line and at the end of the production line with both production wafers and experimental wafers. However, yield enhancement methodologies in the manufacturing environment produce an abundance of very detailed data for a large number of wafers on processes subject only to minor variations. Major variations in the processes are not possible because of the time and cost of using production equipment and production wafers. Setup times for equipment and processing time can range from weeks to months, and processed wafers can each contain hundreds of thousands of dollars worth of integrated circuits.

The learning cycle for the improvement of systems and processes requires coming up with an idea, formulating a test(s) of the idea, testing the idea to obtain data, studying the data to determine the correctness of the idea, and developing new ideas based on the correctness of the first idea. The faster the correctness of ideas can be determined, the faster new ideas can be developed. Unfortunately, the manufacturing environment provides a slow learning cycle because of manufacturing time and cost.

Recently, the great increase in the complexity of integrated circuit manufacturing processes and the decrease in time between new product conception and market introduction have both created the need for speeding up the learning cycle.

This has been accomplished in part by the unique development of the integrated circuit research and development environment. In this environment, the learning cycle has been greatly speeded up and innovative techniques have been developed that have been extrapolated to high volume manufacturing facilities.

To speed up the learning cycle, processes are speeded up and major variations are made to many processes, but only a few wafers are processed to reduce cost. The research and development environment has resulted in the generation of tremendous amounts of data and analysis for all the different processes and variations. This, in turn, has required a large number of engineers to do the analysis. With more data, the answer always has been to hire more engineers.

However, this is not an acceptable solution for major problems.

The problems include, but are not limited to, memory manufacturing, test, sort, verification failure analysis, and process improvements in both embedded and stand-alone applications. As the demand for memory increases, especially for non-volatile memory, improvements are required to reliably and efficiently provide the memory solutions.

Solutions to these problems have been long sought but prior developments have not taught or suggested any solutions and, thus, solutions to these problems have long eluded those skilled in the art.

DISCLOSURE OF THE INVENTION

The present invention provides a memory array tester information processing system including executing a generation block to gather drain currents and gate voltages information for a memory array, utilizing an extraction block to obtain the drain currents and the gate voltages a portion of the memory array and an entire memory array from the generation block or stored information, and executing an analysis block to operate on the drain currents and the gate voltages from the extraction block to correlate operations on the portion of the memory array and the entire memory array. The system includes utilizing a presentation block to format the information used in the analysis block and the results of the analysis block to compute a peak threshold voltage for the memory array.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
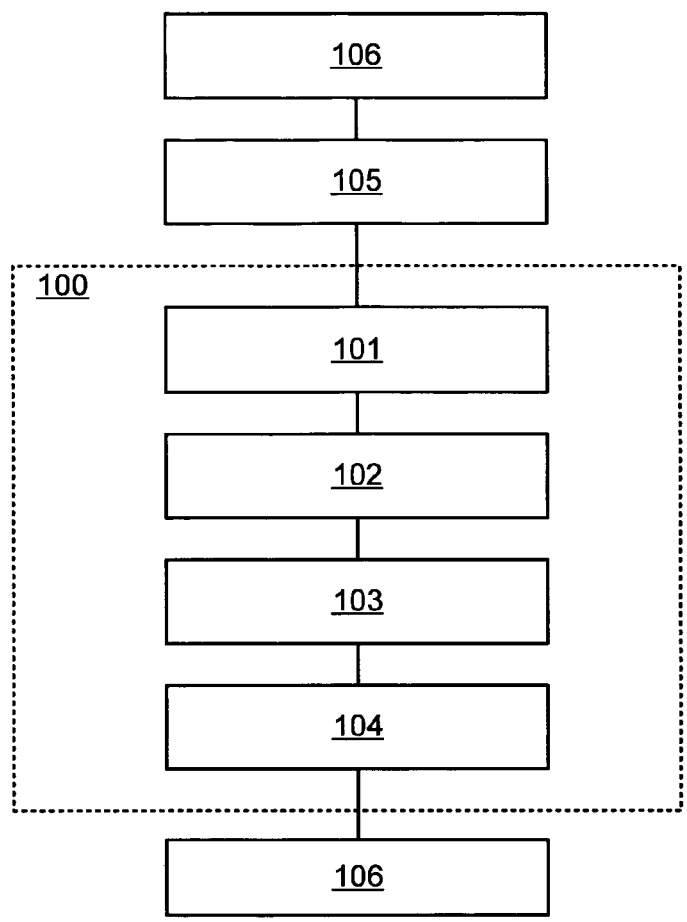
FIG. 1 shows a block diagram of a memory array test system according to the present invention.

In the following description, numerous specific details are given to provide a thorough understanding of the invention. However, it will be apparent that the invention may be practiced without these specific details. In order to avoid obscuring the present invention, some well-known circuits, package configurations, and process steps are not disclosed in detail.

Likewise, the drawings showing embodiments of the apparatus are semi-diagrammatic and not to scale and, particularly, some of the dimensions are for the clarity of presentation and are shown greatly exaggerated in the drawing FIGs.

Similarly, although the block views in the drawings for ease of description show the invention with process flow as oriented downward, this arrangement in the FIGs. is arbitrary and is not intended to suggest that invention should necessarily be in a downward direction. Generally, the apparatus can be operated in any direction. The same numbers are used in all the drawing FIGs. to relate to the same elements.

The term "horizontal" as used herein is defined as a plane parallel to the conventional plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

A Flash cell is basically a floating-gate MOS transistor, such as a transistor with a gate completely surrounded by dielectric materials to form the floating gate (FG). The FG is electrically governed by a capacitively coupled control gate (CG). Being electrically isolated, the FG acts as the storing electrode for the memory cell device with charge injected in the FG and maintained there. The "trapped" charge in the FG allows for the modulation of the "apparent" threshold voltage as seen from the CG of the memory cell transistor. The quality of the dielectric materials provides the nonvolatility property, while the thickness allows the possibility to program or erase the cell by electrical pulses. The gate dielectric material is between the transistor channel and the FG, wherein the gate dielectric material may be an oxide and is called "tunnel oxide" since FN electron tunneling occurs through it. In another implementation of a Flash cell, a triple layer of oxide-nitride-oxide (ONO) is formed on a silicon substrate, with nitride acting as a charge-trapping layer, capacitively coupled to the CG.

A threshold voltage may be defined as the minimum voltage required on the gate, also referred to as the control gate, of a transistor for current to flow between the transistor's drain and source. This definition is further qualified by specifying a drain-to-source current. For Flash and similar non-volatile memories, the threshold voltage of a cell is proportional to the charge stored on the floating gate or the charge-trapping layer of the cell.

A threshold voltage distribution of Flash memories is a key parameter to provide information about the memory cells capability to store data. Threshold voltage shifts and distribution are routinely monitored, especially in the early stages of product development to find design and process problems. Leakage of charge from the floating gate would result in a lower threshold voltage and eventually result in wrong data being read from the memory cell. In fact changes in $V_{th}$ with time, temperature, Program-Erase Cycles, and with Read cycles provides an indication of the endurance of the Flash device.

To evaluate the $V_{th}$ distribution, measurements must be made on a large number of memory cell transistors spread over a large area of the die. The newer multibits per cell devices rely on precise control of threshold voltages. This has increased the importance of threshold voltage measurements in the industry.

Referring now to FIG. 1, therein is shown a block diagram of a memory array tester information processing system 100 according to the present invention. The memory array tester information processing system 100 is the result of the discovery that at times a single fundamental block can solve the problems presented but often there are four fundamental blocks to solving the problems presented.

The four fundamental blocks are a generation block 101, an extraction block 102, an analysis block 103, and a presentation block 104. Each of the blocks can stand independently in the memory array tester information processing system 100, and within these blocks are various commercially available techniques, methodologies, processes, and approaches as well as the invention disclosed herein. The four fundamental blocks are discussed in the approximate chronology that the blocks are used in the memory array tester information processing system 100. The goal of the four fundamental blocks is the support of a production block 107.

The memory array tester information processing system 100 includes various pieces of commercially available production, test, research, and development semiconductor equipment, which operate on and manipulate information and/or data, which are generically defined herein as "information". The memory array tester information processing system 100 receives information from a tester 105, which is connected to a system-under-test 106.

The tester 105 may be any number of test systems, such as a semiconductor test equipment for testing wafers or die, test bench instrumentations, compute devices, system diagnostic boards and firmware, circuitry, or any combination thereof. The interface from the tester 105 to the system-under-test 106 may be any number interconnects, such as wires, wireless, direct connections, or network connections.

The system-under-test 106 may be a complete wafer, a memory die, packaged memory devices, integrated circuits with embedded memory, system boards with memory devices, or a combination thereof. The system-under test 106 may be mounted on any number of structures, such as a wafer carrier, a semiconductor test equipment board, a test bench board, or a system board.

In the generation block 101, information is generated looking at new and old memory products, new and old processes, product and process problems, unexpected or unpredictable results and variations, etc. Generation of the information may be obtained in any number of ways, such as utilizing the tester 105 to retrieve information from the system-under-test 106, stored test information, a compute device, or information over a network. It may also require new equipment and/or methods, which are described herein when required.

The generation block 101 may generate a number of information types for the memory array, such as an amount of electric current or voltage levels. The generated information may be gathered from any part of the system-under-test 106, such as from the entire wafer, the entire memory array, a portion of the memory array, or a test structure.

As memory utilization and size increase, the amount of test information generated increases requiring more time for the system-under-test 106, the tester 105, and personnel. The additional time increases cost and decreases throughput. The generation block 101 may be implemented in any number of ways, such as with software or circuitry.

In the extraction block 102, usable information is extracted from the generated information from the generation block 101. Essentially, the generated information is translated into more useful forms; e.g., broken apart so it can be reassembled in different forms to show different inter-relationships.

For example, most testing equipment provides raw data in massive test files. Sometimes, millions of measurements provide millions of pieces of information, which must be digested and understood. The test files seldom have user-friendly tabular and/or graphical outputs of parameters and values of interest. Even where somewhat user-friendly outputs are provided, there are problems with the proper schema for storing the usable data and for formatting the data for subsequent analysis.

Extraction of the usable information may also require new equipment and/or methods. Sometimes, extraction includes storing the information for long duration experiments or for different experiments, which are described herein when required.

The extraction block 102 for memory arrays may include extracting the appropriate information, such as the amount of electric current or voltage levels, from the generation block 101. The extraction block 102 may extract current or past information of various categories, such as between wafer lines, in a wafer line, at a wafer level, of an entire memory array, a part of a memory array, a test structure, from past data, from process data, or for reliability information. The extraction block 102 may be implemented in any number of ways, such as with software or circuitry.

In the analysis block 103, the usable information from the extraction block 102 is analyzed. Unlike previous systems where a few experiments were performed and/or a relatively few data points determined, the sheer volume of experiments and data precludes easy analysis of trends in the data or the ability to make predictions based on the data. Analysis of the extracted information may also require new equipment and/or methods, which are described herein when required.

As memory utilization and size increase, the amount reliability and test information increases. The analysis block 103 may utilize representative portions of the information from the extraction block 102 and perform operations balancing the need to provide the reliable representative analysis results while minimizing the amount of information needed for analysis. The analysis block 103 may be implemented in any number of ways, such as with software or circuitry. For illustrative purposes, the analysis block 103 may utilize a portion of a memory array (not shown), test structures (not shown), or modeling of an equivalence-based memory from the extracted data.

In the presentation block 104, the analyzed information from the analysis block 103 is manipulated and presented in a comprehensible form to assist others in understanding the significance of the analyzed data. The huge amount of analyzed information often leads to esoteric presentations, which are not useful per se, misleading, or boring. Proper presentation often is an essential ingredient for making informed decisions on how to proceed to achieve yield and processing improvements. The presentation block 104 may be implemented in any number of ways, such as with software or circuitry. In some cases, problems cannot even be recognized unless the information is presented in an easily understood and digested form, and this often requires new methods of presentation, which are described herein when required.

The presentation block 104 for memory array may present the extracted data and the analysis in any number of ways, such as comparing memory array or wafer information and comparing fit with the selected portions or test structures. Correlation information may be presented to validate memory array architecture as well as analysis fit.

Figure 2:
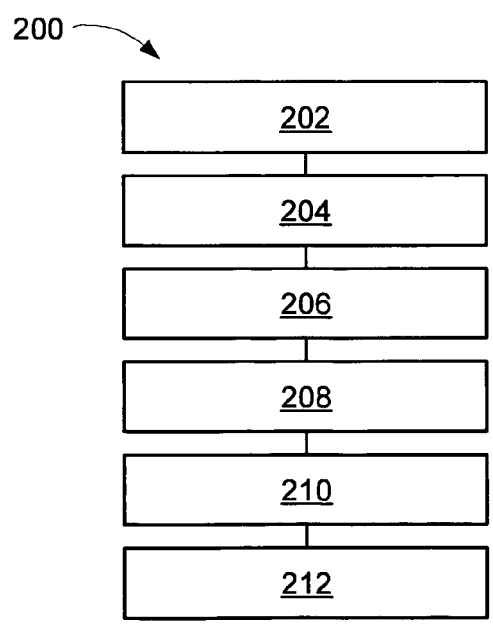
FIG. 2 shows more details of the analysis block according to the present invention.

Referring now to FIG. 2, therein are shown more details of the analysis block 103 according to the present invention. Many measurements are used during the characterization of memory arrays requiring the value of the memory array peak threshold voltage. Often, there is not a direct method to measure this voltage either due to structural or time limitations. The analysis block 103 according to the present invention allows quick determination of the memory array peak threshold voltage.

Many measurements are used during the characterization of the memory arrays require application of correct voltage to all the word lines in the memory array. The choice of the gate voltage depends on the value of the memory array peak threshold voltage. Often, there is not a direct method to measure the peak threshold voltage without adding circuit overhead for separate access to all of the word lines and bit lines in the memory arrays for measuring the threshold of all the memory cells separately. Also, measuring the threshold voltage of every memory cell in the memory array is time-consuming.

The analysis block 103 according to the present invention provides a method to find peak threshold voltage in any memory array without requiring separate access to all the word lines and bit lines. The memory array peak threshold voltage may be determined by measuring only one drain current and gate voltage, $I_d$–$V_g$, curve of a whole memory array or a part of the memory array. The analysis to determine the memory array peak threshold voltage utilizes single cell or partial characteristics, such as values of threshold voltages, subthreshold swing (STS), threshold distribution width ($\Delta$), and variance ($\sigma^2$).

In a block 202, the drain current ($I_d$) of a single memory cell may be expressed as a function of the gate voltage ($V_g$) and threshold voltage ($V_t$) as shown by equation 1. The "S" is a parameter independent of the threshold voltage, such as subthreshold swing.

$$I_d(V_g, V_t) = e^{S(V_g - V_t)} \tag{1}$$

In a block 204, the distribution of the threshold voltage of the memory array may be represented as a Gaussian distribution as shown by equation 2.

$$P(V_t) = \frac{1}{\sqrt{2\pi}\,\sigma} e^{-\left(\frac{(V_t - V_p)^2}{2\sigma^2}\right)} \tag{2}$$

In a block 206, integration have linear properties such that the memory array drain current ($I_{d,tot}$) of N instances of single memory cells may be determined by integrating the single memory cell drain current, $I_d$ of equation 1, with the Gaussian distribution, $P(V_t)$ of equation 2, as shown by equation 3.

$$I_{d,tot} = N \int_{V_{t,\min}}^{V_{t,\max}} P(V_t) \times I_d(V_g, V_t) dV_t \tag{3}$$

In a block 208, inserting equation 1 and equation 2 into equation 3 forms the memory array drain current ($I_{d,tot}$) in the form shown in equation 4.

$$I_{d,tot} = \frac{e^{SV_g}N}{\sqrt{2\pi}\,\sigma} \int_{V_{t,\min}}^{V_{t,\max}} e^{-\frac{(V_t-V_p)^2}{2\sigma^2}} e^{-SV_t} dV_t \qquad (4)$$

After some mathematical manipulation and substitutions, the memory array drain current ($I_{d,tot}$) can be found in the form shown in equation 5.

$$I_{d,tot} = e^{S(V_g-V_p)} \frac{Ne^{\frac{S^2\sigma^2}{2}}}{2\sqrt{2}\,\sigma} \left[ \frac{2}{\sqrt{\pi}} \int_{\frac{V_{t,\min}-V_p+S\sigma^2}{\sqrt{2}\,\sigma}}^{\frac{V_{t,\max}-V_p+S\sigma^2}{\sqrt{2}\,\sigma}} e^{-u^2} du \right] \qquad (5)$$

After further mathematical manipulation and substitutions, the memory array drain current ($I_{d,tot}$) can be found in the form shown in equation 6.

$$I_{d,tot} = e^{S(V_g-V_p)} \frac{Ne^{\frac{S^2\sigma^2}{2}}}{2\sqrt{2}\,\sigma} \left[ \mathrm{erf}\left(\frac{\frac{\Delta}{2}+S\sigma^2}{\sqrt{2}\,\sigma}\right) - \mathrm{erf}\left(-\frac{-\frac{\Delta}{2}+S\sigma^2}{\sqrt{2}\,\sigma}\right) \right] \qquad (6)$$

In the equation 6, the width ($\Delta$) of the threshold voltage distribution $P(V_t)$, which has a peak subthreshold voltage ($V_p$) with a minimum threshold voltage ($V_{t,\min}$) and a maximum threshold voltage ($V_{t,\max}$), is defined as shown by equation 7.

$$\frac{\Delta}{2} = V_{t,\max} - V_p = V_p - V_{t,\min} \qquad (7)$$

The "S" and "$\Delta$" parameters are measured values with "$\sigma$" as a fitting parameter for the Gaussian distribution. The number of memory cell instances N is a known parameter. A function $K(N,S,\Delta,\sigma)$ may be determined such that $I_{d,tot}$ may be expressed as shown by equation 8.

$$I_{d,tot} = e^{S(V_g-V_p)} K(N,S,\Delta,\sigma) \qquad (8)$$

In a block 210, the parameter $V_{g1}$, such that log of $I_{d,tot}$ ($V_{g1}$) equals to zero, is provided from a graphical analysis of the gate voltage ($V_g$) with the natural log of $I_{d,tot}$. The function $K(N,S,\Delta,\sigma)$ may be determined earlier such that the subthreshold voltage peak, $V_p$, may be determined as shown by equation 9.

$$V_p = V_{g1} + \frac{\ln K(N,S,\Delta,\sigma)}{S} \qquad (9)$$

In a block 212, an entire memory array peak threshold value at 1 μA, $V_t(1\,\mu A)$, may be determined using the single memory cell offset, $\Delta V_{p,1\,\mu A}$, between the X-intercept of the natural log of $I_d$ and 1 μA $V_t$ as shown in equation 10.

$$V_t(1\,\mu A) = V_p + \Delta V_{p,1\,\mu A} \qquad (10)$$

The memory array peak threshold value at 1 μA, $V_t(1\,\mu A)$, may be utilized to decrease test time and increase throughput of the production block 107. For illustrative purposes, the details of the analysis block 103 are depicted as fundament blocks from the block 202 to the block 212, although it is understood the details of the analysis block 103 may be partitioned differently or in different chronology.

Figure 3:
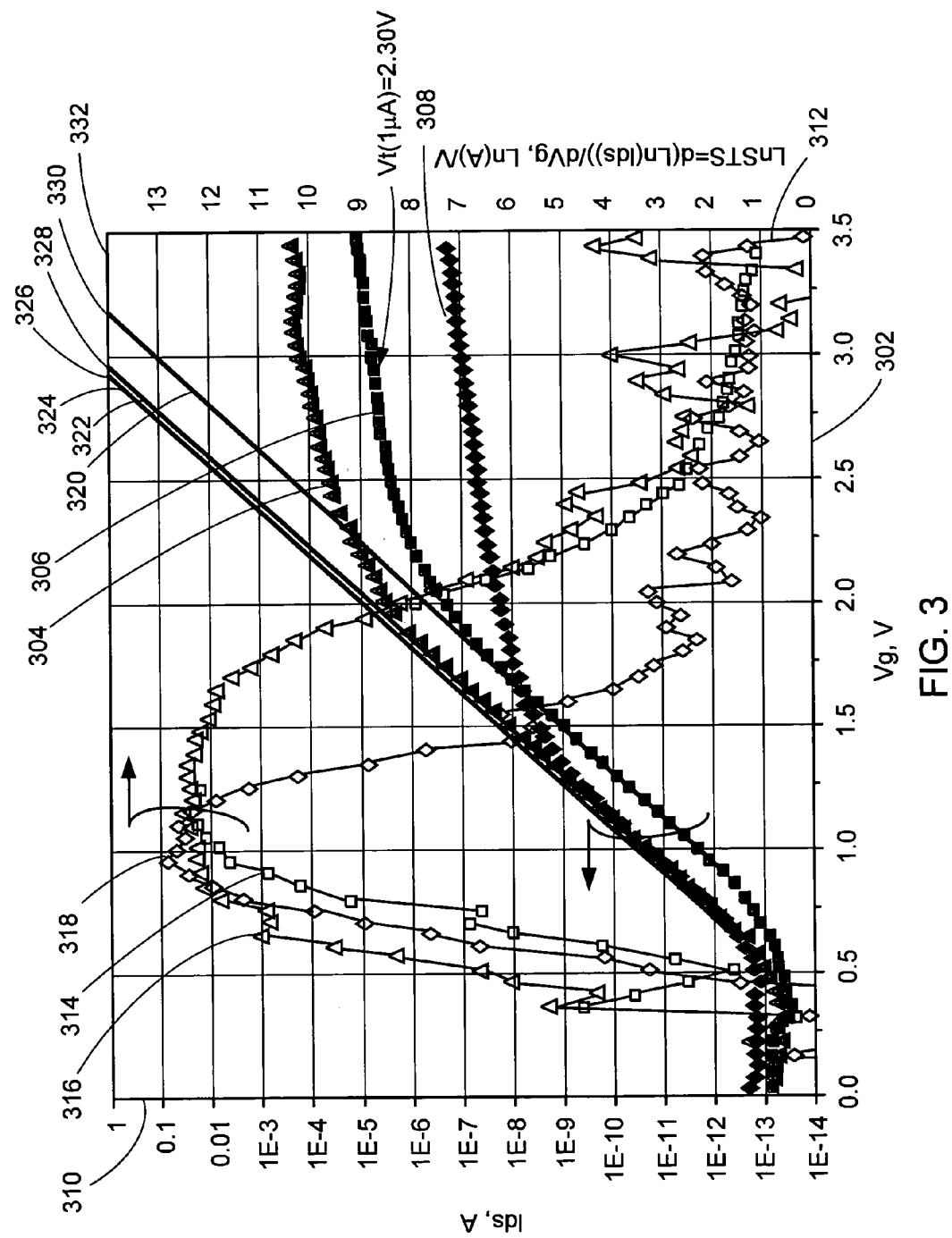
FIG. 3 shows more details of the presentation block according to the present invention.

Referring now to FIG. 3, therein are shown more details of the presentation block 104 according to the present invention. The presentation block 104 graphically depicts the key parameters, results, and information from the analysis block 103. The gate voltage ($V_g$) is on an x-axis 302 and a number of the drain currents $I_d$ are graphed, such as a single memory cell I-V graph 304, a part of the memory array I-V graph 306, and a memory array I-V graph 308, with the values of the drain currents $I_d$ on a left y-axis 310.

A derivative or a change of a natural log of the drain currents $I_d$ over the change of the gate voltage ($V_g$) are graphed with the natural log of the drain currents $I_d$ is on a right y-axis 312 and the gate voltage ($V_g$) on the x-axis 302, such as a single memory cell gm-V graph 314, a part of the memory array gm-V graph 316, and a memory array gm-V graph 318. A single memory cell linear graph 320, a part of the memory array linear graph 322, and a memory array linear graph 324, are linear portions of the single memory cell I-V graph 304, the part of the memory array I-V graph 306, and the memory array I-V graph 308, respectively, extended to a single cell X-intercept 330, a part of the memory array X-intercept 326, and a memory array X-intercept 328, $V_{g1}$, respectively, on an elevated x-axis 332 with $I_d$=1.

The presentation block 104 provides a comparison of a single memory cell, a part of the memory array, and the entire memory array to graphically depict the parameters, results, and information from the analysis block 103. For illustrative purposes, the presentation block 104 depicts a graphical format of some of the information from the analysis block 103, although it is understood that other formats may be used to express information from the analysis block 103 or a combination thereof, as well. More information may be also formatted from the presentation block 104.

It has been discovered that the present invention thus has numerous aspects.

It has been discovered that the measurement equipments utilization time may be reduced and device production throughput may be increase with the analytical approaches provided by the present invention. Threshold voltage, especially peak threshold voltage, are key parameters for the testing, sorting, and monitoring the performance of non-volatile memories during design, manufacturing, yield improvements, test bench verification, system diagnostics, and field returns. The memory array tester information processing system efficiently and reliably verifies key parameters of the memory arrays without extensive device overhead or extensive data collection. The cost and time savings becomes more apparent as the memory array size increases and the utilization of memory arrays increases.

An aspect is that the present invention utilizes measurements of a portion of the memory array or an entire memory array to correlate the needed values to minimize future measurements to a smaller subset. Using models of the threshold voltage distribution along with mathematical properties of integration, mathematical expressions may be manipulated and with appropriate measured information, the desired peak threshold voltage may be obtained with less data collection required.

Another aspect of the present invention is that the subset of memory array measurements may be used to expedite other processes in memory array manufacturing and test. The state or charge-loss level of the portion of the memory array used, or also referred to as reference cells in the array, may be monitored with the results of the peak threshold voltage. Memory erase (ER) or program read (PR) functions may be performed through verifying by array peak location without erase verify (EV) or program verify (PV) level determinations.

These and other valuable aspects of the present invention consequently further the state of the technology to at least the next level.

Thus, it has been discovered that the memory system method and apparatus of the present invention furnish important and heretofore unknown and unavailable solutions, capabilities, and functional aspects for memory systems. The resulting processes and configurations are straightforward, cost-effective, uncomplicated, highly versatile, accurate, sensitive, and effective, and can be implemented by adapting known components for ready, efficient, and economical manufacturing, application, and utilization.

The resulting processes and configurations are straightforward, cost-effective, uncomplicated, highly versatile and effective, can be implemented by adapting known technologies, and are thus readily suited for efficiently and economically manufacturing memory systems.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

The invention claimed is:

1. A memory array tester information processing system comprising:
   executing a generation block to gather drain currents and gate voltages information for a memory array;
   utilizing an extraction block to obtain the drain currents and the gate voltages a portion of the memory array and an entire memory array from the generation block or stored information;
   executing an analysis block to operate on the drain currents and the gate voltages from the extraction block to correlate operations on the portion of the memory array and the entire memory array; and
   utilizing a presentation block to format the information used in the analysis block and the results of the analysis block to determine a peak threshold voltage for the entire memory array.

2. The system as claimed in claim 1 further comprising performing a function of a memory erase (ER) without a erase verify (EV).

3. The system as claimed in claim 1 further comprising performing a function of a program read (PR) without a program verify (PV).

4. The system as claimed in claim 1 further comprising monitoring a state and a charge-loss level of the portion of the memory array.

5. The system as claimed in claim 1 further comprising testing wafers with the peak threshold voltage monitored.

6. A memory array tester information processing system comprising:
   executing a generation block to gather drain currents and gate voltages information for a memory array; and
   executing an analysis block to determine an entire memory array peak threshold voltage at 1 µA by an execution of $V_t(1\ \mu A) = V_p + \Delta V_{p,1\ \mu A}$, wherein $V_p$ is a peak subthreshold voltage of the entire memory array and $\Delta V_{p,1\ \mu A}$ is the single cell offset between the X-intercept of the natural log of $I_d$ and 1 µA $V_t$.

7. The system as claimed in claim 6 wherein executing the analysis block comprises determining the peak subthreshold voltage, $$V_p = V_{g1} + \frac{\ln K(N, S, \Delta, \sigma)}{S},$$

including an X-intercept $V_{g1}$ and a function K of the number of cells of the entire memory array N, a parameter S, a width of a threshold distribution $\Delta$, and a variance of the threshold distribution $\sigma$.

8. The system as claimed in claim 6 further comprising determining a threshold voltage distribution by $$P(V_t) = \frac{1}{\sqrt{2\pi}\ \sigma} e^{-\left(\frac{(V_t - V_p)^2}{2\sigma^2}\right)}$$

of the entire memory array.

9. The system as claimed in claim 6 further comprising determining an entire memory array current by $I_{d,tot} = e^{S(V_g - V_p)} K(N, S, \Delta, \sigma)$, wherein a function K of the number of cells of the entire memory array N, a parameter S, a width of a threshold distribution $\Delta$, and a variance of the threshold distribution $\sigma$.

10. The system as claimed in claim 6 further comprising determining an entire memory current by integrating a drain current, $I_d$, of single memory cell and a threshold voltage distribution, $P(V_t)$.

11. A memory array tester information processing system comprising:
   generation circuitry to gather drain currents and gate voltages information for a memory array;
   extraction circuitry to obtain the drain currents and the gate voltages a portion of the memory array and an entire memory array from the generation block or stored information;
   analysis circuitry to operate on the drain currents and the gate voltages from the extraction block to correlate operations on the portion of the memory array and the entire memory array; and
   presentation circuitry to format the information used in the analysis block and the results of the analysis block to determine a peak threshold voltage for the entire memory array.

12. The system as claimed in claim 11 further comprising circuitry for performing a function of a memory erase (ER) without a erase verify (EV).

13. The system as claimed in claim 11 further comprising circuitry for performing a function of a program read (PR) without a program verify (PV).

14. The system as claimed in claim 11 further comprising circuitry for monitoring a state and a charge-loss level of the portion of the memory array.

15. The system as claimed in claim 11 further comprising wafers with the peak threshold voltage monitored.

16. A memory array tester information processing system comprising:
   generation circuitry to gather drain currents and gate voltages information for a memory array; and
   analysis circuitry for executing an analysis to determine an entire memory array peak threshold voltage at 1 µA by an execution of $V_t(1\ \mu A) = V_p + \Delta V_{p,1\ \mu A}$, wherein $V_p$ is a peak subthreshold voltage of the entire memory array and $\Delta V_{p,1\ \mu A}$ is the single cell offset between the X-intercept of the natural log of $I_d$ and $1\ \mu A\ V_t$.

17. The system as claimed in claim 16 wherein the analysis circuitry includes circuitry for determining the peak subthreshold voltage, $$V_p = V_{g1} + \frac{\ln K(N, S, \Delta, \sigma)}{S},$$

including an X-intercept $V_{g1}$ and a function K of the number of cells of the entire memory array N, a parameter S, a width of a threshold distribution $\Delta$, and a variance of the threshold distribution $\sigma$.

18. The system as claimed in claim 16 further comprising circuitry for determining a threshold voltage distribution by $$P(V_t) = \frac{1}{\sqrt{2\pi}\ \sigma} e^{-\left(\frac{(V_t - V_p)^2}{2\sigma^2}\right)}$$

of the entire memory array.

19. The system as claimed in claim 16 further comprising circuitry for determining an entire memory array current by $I_{d,tot} = e^{S(V_g - V_p)} K(N,S,\Delta,\sigma)$, wherein a function K of the number of cells of the entire memory array N, a parameter S, a width of a threshold distribution $\Delta$, and a variance of the threshold distribution $\sigma$.

20. The system as claimed in claim 16 further comprising circuitry for determining an entire memory current by integrating a drain current, $I_d$, of single memory cell and a threshold voltage distribution, $P(V_t)$.

* * * * *